US012603617B2

(12) United States Patent
Lin

(10) Patent No.: US 12,603,617 B2
(45) Date of Patent: Apr. 14, 2026

(54) HIGH ACCURACY LOW NOISE VOLTAGE DELIVERY NETWORK AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 461 days.

(21) Appl. No.: 18/484,547

(22) Filed: Oct. 11, 2023

(65) Prior Publication Data

US 2025/0123644 A1 Apr. 17, 2025

(51) Int. Cl.
*H03F 1/26* (2006.01)
*H03F 3/45* (2006.01)

(52) U.S. Cl.
CPC ........... *H03F 1/26* (2013.01); *H03F 3/45475* (2013.01); *H03F 2203/45526* (2013.01)

(58) Field of Classification Search
CPC ......... H03F 3/217; H03F 3/44; H03H 7/0115; H03K 5/24; G05F 1/56; G05F 3/26; H02M 3/07
USPC ....................................................... 330/158
See application file for complete search history.

(56) References Cited

U.S. PATENT DOCUMENTS

| | | | | |
|---|---|---|---|---|
| 7,068,103 B2 * | 6/2006 | Lind | ...................... | H03F 3/217 |
| | | | | 330/253 |
| 8,692,529 B1 * | 4/2014 | Wyatt | ...................... | G05F 1/56 |
| | | | | 323/280 |
| 10,747,249 B1 * | 8/2020 | Subramanian | .......... | G05F 1/575 |
| 2021/0091735 A1 * | 3/2021 | Wang | ...................... | H03F 3/213 |

OTHER PUBLICATIONS

Analog Devices Application NoteAN 138—"Low Noise Voltage Reference Buffers" (1989, rev.2006) (Year: 2006).*
TexasInstruments Application BulletinSBOA088 (AN 940): ActiveRCFilters UsingOpAmps (Year: 2011).*
LinearTechnology(Analog Devices) Application NoteAN 82: "Noise Reduction Techniques for Voltage References" (1989) (Year: 1989).*
Du et al., An Ultra-Low Quiescent Current CMOS Low-Dropout Regulator with Small Output Voltage Variations, Journal of Power and Energy Engineering, 2014, 2, 477-482. (Year: 2014).*
Sirtoli et al., "Design of current sources for load common mode optimization", J Electr Bioimp, vol. 9, pp. 59-71, 2018. (Year: 2018).*

(Continued)

*Primary Examiner* — Hafizur Rahman
(74) *Attorney, Agent, or Firm* — McClure, Qualey & Rodack, LLP

(57) ABSTRACT
A voltage delivery network includes a first unity gain amplifier and a second unity gain amplifier configured in a back-to-back connection topology to receive a first voltage and a second voltage at a first node and a second node, respectively, and jointly output a third voltage at a third node. The network delivery network further includes a first resistor inserted between the third node and the second node; and a first capacitor inserted between the second node and a DC (direct current) node.

20 Claims, 3 Drawing Sheets

(56)         References Cited

OTHER PUBLICATIONS

Ma et al., "Design of A Reference Buffer with Ultralow Output Resistance for", 2021 IEEE 14th International Conference on ASIC. (Year: 2021).*

Anshul Shah, Why Does Voltage Reference Noise Matter? vol. 54 No 2, Mar. 2020, Analog Devices (Year: 2020).*

Chapter 3: Reference Voltage Buffer, Springer International Publishing AG 2018 (Year: 2018).*

Guangmao Xing, "Self-Biased Unity-Gain Buffers With Low Gain Error", IEEE Transactions on Circuits and Systems-II : Express Briefs, vol. 56, No. 1, Jan. 2009 (Year: 2009).*

Carvajal, et al.: "The Flipped Voltage Follower: A Useful Cell for Low-Voltage Low-Power Circuit Design"; IEEE Transactions on Circuits and Systems-I: Regular Papers, vol. 52, No. 7, Jul. 2005; pp. 1276-1291.

* cited by examiner

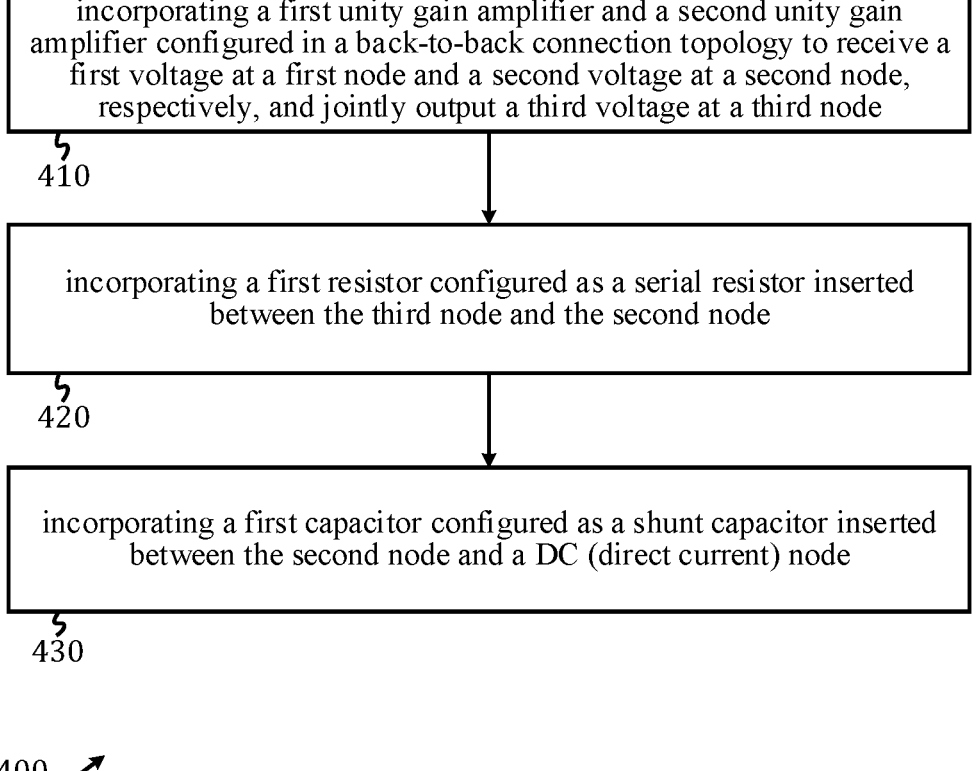

incorporating a first unity gain amplifier and a second unity gain amplifier configured in a back-to-back connection topology to receive a first voltage at a first node and a second voltage at a second node, respectively, and jointly output a third voltage at a third node

410 incorporating a first resistor configured as a serial resistor inserted between the third node and the second node

420 incorporating a first capacitor configured as a shunt capacitor inserted between the second node and a DC (direct current) node

HIGH ACCURACY LOW NOISE VOLTAGE DELIVERY NETWORK AND METHOD THEREOF

BACKGROUND OF THE DISCLOSURE

Field of the Disclosure

The present invention generally relates to voltage delivery, and more particularly relates to voltage delivery with high accuracy and low noise.

Description of Related Art

A bias voltage is a voltage used to establish a biasing condition of a transistor to fulfill a certain function. In many applications, a bias voltage is generated by a master circuit and delivered to a slave circuit using a distribution network. One first objective of the delivery network is to have a high accuracy, so that a DC (direct current) level of a voltage delivered to the slave circuit is substantially equal to a DC level of the bias voltage. Another objective of the delivery network is to provide noise filtering, so that the voltage delivered to the salve circuit has low noise. A common way of noise filtering is using a RC (which means resistor-capacitor) low-pass filter comprising a serial resistor and a shunt capacitor. To ensure low noise, a corner frequency of the RC low-pass filter must be small, wherein a large resistor and a large capacitor are required. A large resistor, however, is prone to generating a voltage drop known as "IR drop," wherein a small load current from the slave circuit will cause the DC level of the voltage delivered to the slave circuit to be markedly different from the DC level of the bias voltage. In other words, the accuracy is adversely compromised. Therefore, the two objectives, high accuracy and low noise, generally cannot be fulfilled at the same time without making traded offs.

What is desired is a voltage delivery network that can achieve both high accuracy and low noise.

BRIEF DESCRIPTION OF THIS DISCLOSURE

An objective of the present disclosure is to receive a first voltage and output a second voltage, such that the second voltage is substantially equal to the first voltage in DC (direct current) level and is much less noisy than the first voltage.

In an embodiment, a voltage delivery network comprises: a first unity gain amplifier and a second unity gain amplifier configured in a back-to-back connection topology to receive a first voltage and a second voltage at a first node and a second node, respectively, and jointly output a third voltage at a third node; a first resistor inserted between the third node and the second node; and a first capacitor inserted between the second node and a DC (direct current) node.

In an embodiment, a method of voltage delivery comprises: incorporating a first unity gain amplifier and a second unity gain amplifier configured in a back-to-back connection topology to receive a first voltage at a first node and a second voltage at a second node, respectively, and jointly output a third voltage at a third node; incorporating a first resistor configured as a serial resistor inserted between the third node and the second node; and incorporating a first capacitor configured as a shunt capacitor inserted between the second node and a DC (direct current) node.

BRIEF DESCRIPTION OF THE DRAWINGS

FIG. 4 shows a flow diagram of a method of voltage delivery in accordance with an embodiment of the present disclosure.

DETAILED DESCRIPTION OF THIS DISCLOSURE

The present disclosure describes a voltage delivery network. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "current source," "source follower," "common-source amplifier," "opamp (operational amplifier)," "NMOST (n-channel metal oxide semiconductor transistor)," "PMOST (p-channel metal oxide semiconductor transistor)," "DC (direct current)," "power supply," and "ground." Terms like these are used in a context of microelectronics, and the associated concepts are apparent to those of ordinary skills in the art and thus will not be explained in detail here.

A circuit is a collection of a transistor, a resistor, and/or other electronic devices inter-connected in a certain manner to embody a certain function. In this present disclosure, a network is a circuit or a collection of circuits configured to fulfill a certain function.

An NMOST (or a PMOST) is said to be configured in a source follower topology when an input voltage is received at its gate and an output voltage is output at its source.

An NMOST (or a PMOST) is said to be configured in a common-source amplifier topology when an input voltage is received at its gate and an output voltage is output at its drain.

Throughout this disclosure, "DC" stands for direct current, and "AC" stands for alternating current. A DC node is a node of a substantially fixed electric potential. In particular, "$V_{DD}$" denotes a first DC node referred to as a power node, and "$V_{SS}$" denotes a second DC node referred to as a ground node. A DC voltage refers to a substantially stationary voltage. An AC voltage refers to a voltage that varies with time in an oscillatory manner and is also referred to as a dynamic voltage.

A unity gain amplifier is an amplifier that receives an input voltage and output an output voltage such that the output voltage is substantially equal to the input voltage when a frequency of the input voltage is lower than a cut-off frequency.

Figure 1:
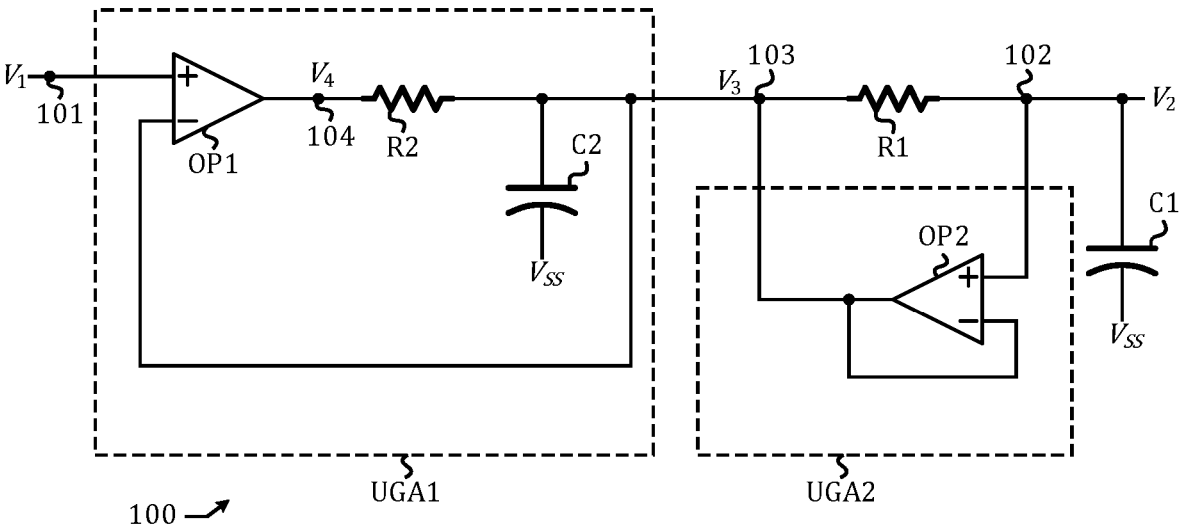
FIG. 1 shows a schematic diagram of a voltage delivery network in accordance with an embodiment of the present disclosure.

A schematic diagram of a voltage delivery network 100 in accordance with an embodiment of the present disclosure is depicted in FIG. 1. The voltage delivery network 100 comprises: a first unity gain amplifier UGA1 and a second unity gain amplifier UGA2 configured in a back-to-back connection topology to receive a first voltage $V_1$ at a first node 101 and a second voltage $V_2$ at a second node 102, respectively, and jointly output a third voltage $V_3$ at a third node 103; a first resistor R1 configured to be a serial resistor inserted between the third node 103 and the second node 102, and a first capacitor C1 configured to be a shunt capacitor inserted between the second node and a ground node "$V_{SS}$". The first unity gain amplifier UGA1 comprises: a first opamp (operational amplifier) OP1 configured to output a fourth voltage $V_4$ at a fourth node 104 in accordance with a difference between the first voltage $V_1$ and the third voltage $V_3$; a second resistor R2 configured to be a serial resistor inserted between the fourth node 104 and the third node 103; and a second capacitor C2 configured to be a shunt capacitor inserted between the third node 103 and the ground node "$V_{SS}$". The second unity gain amplifier UGA2 comprises a second opamp OP2 configured in a noninverting negative feedback topology, wherein an input voltage ($V_2$) is received as a positive input at its positive input terminal denoted by "+," and an output voltage ($V_3$) is fed back as a negative input to its negative input terminal denoted by "−." The first opamp OP1 is also configured in a noninverting negative feedback topology, wherein an input voltage ($V_1$) is received as a positive input at its positive input terminal denoted by "+," and an output voltage (i.e., $V_4$) is fed back as a negative input to its negative input terminal denoted by "−" via the second resistors R2. Due to the negative feedback of the first opamp OP1, a DC level of $V_3$ will be substantially equal to a DC level of $V_1$. Due to the negative feedback of the second opamp OP2, the DC level of $V_3$ will be substantially equal to a DC level of $V_2$. Therefore, the DC level of $V_2$ will be substantially equal to the DC level of $V_1$. An objective of high accuracy is thus fulfilled.

The second resistor R2 and the second capacitor C2 form a low-pass filter to effectively nullify the negative feedback of the first opamp OP1 in response to a high-frequency component of $V_1$. As a result, $V_3$ will track a low-frequency component of $V_1$ but not a high-frequency component of $V_1$. This way, the first unity gain amplifier UGA1 embodies a low-pass filter, wherein $V_3$ is a low-pass filtered version of $V_1$. As long as a corner frequency of the low-pass filter formed by the second resistor R2 and the second capacitor C2 is sufficiently low, a majority of a noise of $V_1$ can be effectively suppressed. In an embodiment, the second capacitor C2 is an explicit circuit element. In another embodiment, the second capacitor C2 is a parasitic capacitor that always exists in an actual circuit implementation in real world.

Both the first unity gain amplifier UGA1 and the second unity gain amplifier UGA2 are subject to generating a circuit noise, resulting in a noise of $V_3$. A low-frequency noise of $V_3$ will be suppressed by the negative feedback of the first opamp OP1, while a high-frequency noise of $V_3$ remains. The first resistor R1 and the first capacitor C1, however, form another low-pass filter so that $V_2$ is a low-pass filtered version of $V_3$. As long as a corner frequency of the low-pass filter formed by the first resistor R1 and the first capacitor C1 is sufficiently low, a majority of a noise of $V_3$ can be effectively suppressed and consequently $V_2$ can have low noise even though the noise of $V_3$ can be large.

Since the first unity gain amplifier UGA1 and the second unity gain amplifier UGA2 jointly output $V_3$, the first opamp OP1 must have a stronger driving capability with a lower output resistance than the second opamp OP2, so that the first unity gain amplifier UGA1 can dominate over the second unity gain amplifier UGA2 and force $V_3$ to effectively track $V_1$. Both the first opamp OP1 and the second opamp OP2 can be implemented by an operational amplifier known in prior art at the discretion of circuit designer.

In an alternative embodiment, the second resistor R2 is removed and replaced by a short circuit. In this case, a noise of $V_1$ may not be effectively suppressed by the first unity gain amplifier UGA1 and may cause $V_3$ to be noisy. However, as explained earlier, a noise of $V_3$ can still be effectively suppressed by the low-pass filter formed by the first resistor R1 and the first capacitor C1.

Figure 2:
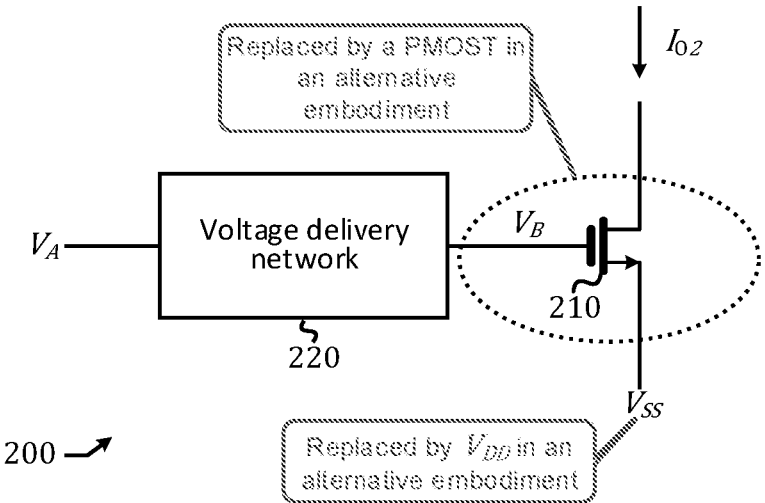
FIG. 2 shows a schematic diagram of a current source utilizing the voltage delivery network of FIG. 1.

In an embodiment, the voltage delivery network 100 is used to bias a current source. As depicted in FIG. 2, a current source 200 comprises an NMOST (n-channel metal oxide semiconductor transistor) 210 configured to output an output current $I_{O2}$ in accordance with a gate voltage $V_B$, which is delivered by a voltage delivery network 220 in accordance with an input voltage $V_A$. The voltage delivery network 220 is embodied by the voltage delivery network 100 of FIG. 1, with $V_1$ and $V_2$ embodying $V_A$ and $V_B$, respectively. In an alternative embodiment, The NMOST 210 is replaced by a PMOST (p-channel metal oxide semiconductor transistor) and the ground node "$V_{SS}$" is replaced by a power supply node "$V_{DD}$". In any case, $V_B$ is a low-noise version of $V_A$, and consequently $I_{O2}$ can be accurately established with low noise.

Figure 3:
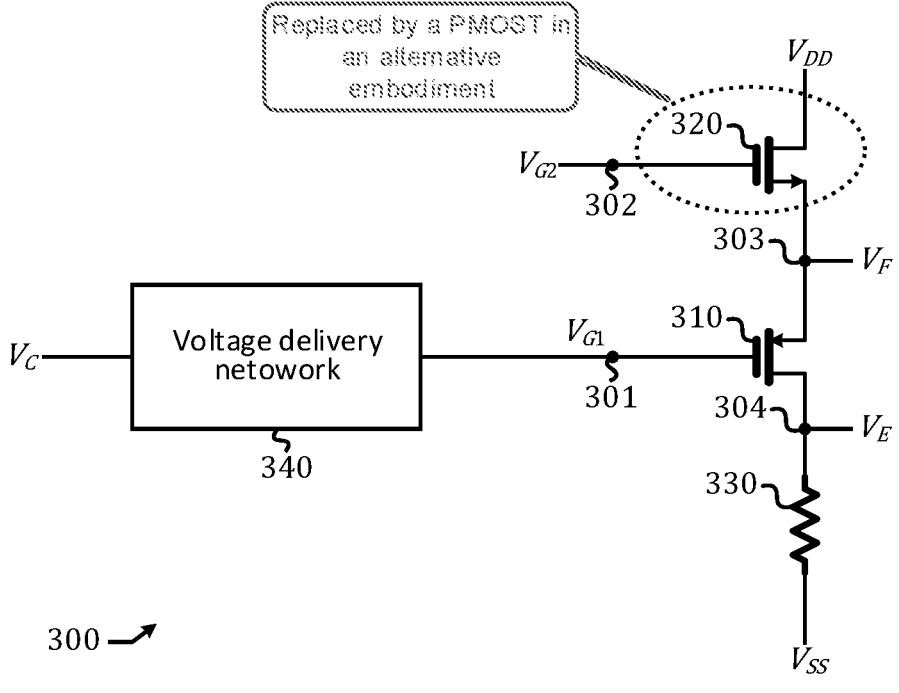
FIG. 3 shows a schematic diagram of an output stage of a FVF (flipped voltage follower) voltage regulator utilizing the voltage delivery network of FIG. 1.

In an embodiment, the voltage delivery network 100 is incorporated in an output stage of a FVF (flipped voltage follower) voltage regulator. As depicted in FIG. 3, an output stage of a FVF voltage follower 300 comprises: a PMOST 310, an NMOST 320, a resistor 330, and a voltage delivery network 340. Both PMOST 310 and NMOST 320 are configured in a source follower topology configured to receive a first gate voltage $V_{G1}$ (at a first gate node 301) and a second gate voltage $V_{G2}$ (at a second gate node 302), respectively, and jointly output an output voltage $V_F$ (at a source node 303) that can be used by a load circuit (not shown in the schematic). A source, a gate, and a drain of PMOST 310 connect to the source node 303, the first gate node 301, and a drain node 304, respectively. A source, a gate, and a drain of NMOST 320 connect to the source node 303, the second gate node 302, and a power supply node $V_{DD}$, respectively. The resistor 330 is inserted between the drain node 304 and a ground node 304 "$V_{SS}$" and is configured to establish an auxiliary output voltage $V_E$. The voltage delivery network 340 receives a reference gate voltage $V_C$ and output the first gate voltage $V_{G1}$ and is embodied by the voltage delivery network 100 of FIG. 1, with $V_1$ and $V_2$ embodying $V_C$ and $V_{G1}$, respectively. In a context of a FVF voltage regulator application, a DC level of the output voltage $V_F$ is determined by a DC level of the first gate voltage $V_{G1}$. Due to using the voltage delivery network 100 of FIG. 1 to embody the voltage delivery network 340, a DC level of $V_{G1}$ is substantially equal to the DC level of reference gate voltage $V_C$, while a noise of the reference gate voltage $V_C$ is greatly suppressed. Therefore, the output voltage $V_F$ has greater accuracy and low noise. In an alternative embodiment, NMOST 320 is replaced by a PMOST configured as a common-source amplifier, wherein a source, a gate, and a drain connect to the power supply node "$V_{DD}$," the second gate node $V_{G2}$, and the source node 303, respectively. This is an alternative embodiment of an output stage of a FVF voltage regulator that is known in the prior art and thus not described in detail.

FVF (flipped voltage follower) voltage regulator has been known in the prior art and it can be implemented in various forms, some of which are described in the paper: R. G.

Carvajal et al, "The flipped voltage follower: a useful cell for low-voltage low-power circuit design," IEEE Trans. On Circuits and Systems I: Regular Paper, vol. 52, pp/1276-1291, 2005.

As demonstrated by a flow diagram 400 depicted in FIG. 4, a method of voltage delivery in accordance with an embodiment of the present disclosure comprises: (step 410) incorporating a first unity gain amplifier and a second unity gain amplifier configured in a back-to-back connection topology to receive a first voltage at a first node and a second voltage at a second node, respectively, and jointly output a third voltage at a third node; (step 420) incorporating a first resistor configured as a serial resistor inserted between the third node and the second node; and (step 430) incorporating a first capacitor configured as a shunt capacitor inserted between the second node and a DC (direct current) node.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A voltage delivery network comprising:
    a first unity gain amplifier and a second unity gain amplifier configured in a back-to-back connection topology to receive a first voltage and a second voltage at a first node and a second node, respectively, and jointly output a third voltage at a third node;
    a first resistor inserted between the third node and the second node; and
    a first capacitor inserted between the second node and a DC (direct current) node.

2. The voltage delivery network of claim 1, wherein the first unity gain amplifier comprises a first operational amplifier configured in a non-inverting negative feedback topology, wherein the first voltage is received as a positive input, the third voltage is fed back as a negative input, the first operational amplifier outputs a fourth voltage at a fourth node in accordance with a difference between the positive input and the negative input, and the fourth node is DC (direct current) coupled to the third node.

3. The voltage delivery network of claim 2, wherein the first unity gain amplifier further comprises a second resistor configured as a serial resistor inserted between the third node and the fourth node.

4. The voltage delivery network of claim 3, wherein the first unity gain amplifier further comprises a second capacitor configured as a shunt capacitor inserted between the third node and the DC node.

5. The voltage delivery network of claim 1, wherein the second unity gain amplifier comprises a second operational amplifier configured in a non-inverting negative feedback topology, wherein the second voltage is received as a positive input, the third voltage is an output that is fed back as a negative input, and the second operational amplifier adjusts the output in accordance with a difference between the positive input and the negative input.

6. The voltage delivery network of claim 1 further comprising a MOST (metal oxide semiconductor transistor) configured as a current source wherein an output current is established in accordance with the second voltage.

7. The voltage delivery network of claim 6, wherein the MOST is a n-channel metal oxide semiconductor transistor.

8. The voltage delivery network of claim 6, wherein the MOST is a p-channel metal oxide semiconductor transistor.

9. The voltage delivery network of claim 1 further comprising an output stage of a FVF (flipped voltage follower) voltage regulator comprising a PMOST (p-channel metal oxide semiconductor transistor), an NMOST (n-channel metal oxide semiconductor transistor), and a resistor, wherein the PMOST and the NMOST are both configured in a source follower topology to jointly output an output voltage in accordance with the second voltage and a gate voltage, respectively, and the resistor is inserted between a drain of the PMOST and a ground node.

10. The voltage delivery network of claim 1 further comprising an output stage of a FVF (flipped voltage follower) voltage regulator comprising a first PMOST (p-channel metal oxide semiconductor transistor), a second PMOST, and a resistor, wherein the first PMOST and the second PMOST are configured in a source follower topology and a common-source amplifier topology to jointly output an output voltage in accordance with the second voltage and a gate voltage, respectively, and the resistor is inserted between a drain of the first PMOST and a ground node.

11. A method of voltage delivery comprising:
    incorporating a first unity gain amplifier and a second unity gain amplifier configured in a back-to-back connection topology to receive a first voltage at a first node and a second voltage at a second node, respectively, and jointly output a third voltage at a third node;
    incorporating a first resistor configured as a serial resistor inserted between the third node and the second node; and
    incorporating a first capacitor configured as a shunt capacitor inserted between the second node and a DC (direct current) node.

12. The method of voltage delivery of claim 11, wherein the first unity gain amplifier comprises a first operational amplifier configured in a non-inverting negative feedback topology, wherein the first voltage is received as a positive input, the third voltage is fed back as a negative input, the first operational amplifier outputs a fourth voltage at a fourth node in accordance with a difference between the positive input and the negative input, and the fourth node is DC (direct current) coupled to the third node.

13. The method of voltage delivery of claim 12, wherein the first unity gain amplifier further comprises a second resistor configured as a serial resistor inserted between the third node and the fourth node.

14. The method of voltage delivery of claim 13, wherein the first unity gain amplifier further comprises a second capacitor configured as a shunt capacitor inserted between the third node and the DC node.

15. The method of voltage delivery of claim 11, wherein the second unity gain amplifier comprises a second operational amplifier configured in a non-inverting negative feedback topology, wherein the second voltage is received as a positive input, the third voltage is an output that is fed back as a negative input, and the second operational amplifier adjusts the output in accordance with a difference between the positive input and the negative input.

16. The method of voltage delivery of claim 13 further comprising incorporating a current source comprising a MOST (metal oxide semiconductor transistor) configured to establish an output current in accordance with the second voltage.

17. The method of voltage delivery of claim 6, wherein the MOST is a n-channel metal oxide semiconductor transistor.

18. The method of voltage delivery of claim 6, wherein the MOST is a p-channel metal oxide semiconductor transistor.

19. The method of voltage delivery of claim 1 further comprising incorporating an output stage of a FVF (flipped voltage follower) voltage regulator comprising a PMOST (p-channel metal oxide semiconductor transistor), an NMOST (n-channel metal oxide semiconductor transistor), and a resistor, wherein the PMOST and the NMOST are both configured in a source follower topology to jointly output an output voltage in accordance with the second voltage and a gate voltage, respectively, and the resistor is inserted between a drain of the PMOST and a ground node.

20. The method of voltage delivery of claim 1 further comprising incorporating an output stage of a FVF (flipped voltage follower) voltage regulator comprising a first PMOST (p-channel metal oxide semiconductor transistor), a second PMOST, and a resistor, wherein the first PMOST and the second PMOST are configured in a source follower topology and a common-source amplifier topology to jointly output an output voltage in accordance with the second voltage and a gate voltage, respectively, and the resistor is inserted between a drain of the first PMOST and a ground node.

\* \* \* \* \*